United States Patent [19]

Hashimoto et al.

[11] Patent Number: 5,076,865

[45] Date of Patent: Dec. 31, 1991

[54] AMORPHOUS ALUMINUM ALLOYS

[75] Inventors: Koji Hashimoto, 2-25-2, Shogen, Izumi-ku, Sendai-shi, Miyagi; Hideaki Yoshioka, Sendai; Katsuhiko Asami, Sendai; Asahi Kawashima, Sendai, all of Japan

[73] Assignees: Yoshida Kogyo K. K.; Koji Hashimoto, both of Japan

[21] Appl. No.: 420,930

[22] Filed: Oct. 13, 1989

[30] Foreign Application Priority Data

Oct. 15, 1988 [JP] Japan .................................. 63-260020
Apr. 24, 1989 [JP] Japan .................................. 1-101768

[51] Int. Cl.$^5$ ........................ C22C 16/00; C22C 30/00
[52] U.S. Cl. ................................... 148/403; 420/422; 420/580
[58] Field of Search .................. 148/403; 420/580, 422

[56] References Cited

U.S. PATENT DOCUMENTS

| | | | |
|---|---|---|---|
| 3,856,513 | 12/1974 | Chen et al. | 420/580 |
| 4,040,129 | 8/1977 | Steinemann et al. | 148/11.5 F |
| 4,595,429 | 6/1986 | Le Laér et al. | 148/403 |
| 4,637,927 | 1/1987 | Komatsu et al. | 420/900 |
| 4,639,363 | 1/1987 | Komatsu et al. | 420/900 |

FOREIGN PATENT DOCUMENTS 0289835 3/1988 European Pat. Off. .
2134926 1/1972 Fed. Rep. of Germany .

OTHER PUBLICATIONS

Gudzenko et al., "Structure of Rapidly Cooled from Liquid State Zr-Alloys", Fiz. Met. Metalloved., vol. 39, No. 6, pp. 1313–1315, 1975, Chemical Abstracts No. 83:208807q.

*Primary Examiner*—R. Dean
*Assistant Examiner*—George Wyszomiersui
*Attorney, Agent, or Firm*—Hill, Van Santen, Steadman & Simpson

[57] ABSTRACT

An amorphous aluminum-valve metal alloy with special characteristics such as high corrosion resistance, high wear resistance and coinsiderable toughness, consisting of Al and at least one element selected from valve metals of Ti and Zr, a portion of the set forth refractory metals being allowed to be substituted with at least one element selected from Mo, W, Ta and Nb.

2 Claims, 1 Drawing Sheet

AMORPHOUS ALUMINUM ALLOYS

BACKGROUND OF THE INVENTION

1. Field of the Invention

The present invention relates to novel amorphous aluminum-valve metal alloys with special characteristics such as high corrosion resistance, high wear resistance and considerable toughness, which can be used industrial plants such as chemical plants as well as various fields of human life.

2. Description of the Prior Art

Since Ti and Zr are corrosion resistant metals, the Al alloys with Ti and/or Zr are expected to possess a high corrosion resistance. However, various compound phases exist in their crystalline alloys prepared by conventional casting methods and hence the solubility range of Ti and/or Zr in Al is narrow.

On the other hand, Ti, Zr, Nb, Ta, Mo and W belong to refractory metals. Melting points of Nb, Ta, Mo and W are higher than the boiling point of Al. It is, therefore, difficult to apply conventional casting methods for production of Al-Ti, Al-Zr and Al-Ti-Zr alloys are with Nb, Ta, Mo and W. If these alloys successfully prepared not as heterogeneous crystalline alloys but as homogeneous amorphous alloys, the alloys have a bright future prospect as novel metallic materials.

Most of the passive films, which can protect metallic materials in mild environments, suffer break down in hydrochloric acids. Because of severe corrosiveness of hydrochloric acids, there are no metallic materials which are corrosion resistant in hydrochloric acids. Currently used aluminum alloys are no exception.

In view of the above-foregoing, there has been a strong demand for further new metallic materials which can be used in such severe environments, that corrode almost all currently used metallic materials.

SUMMARY OF THE INVENTION

It is an objective of the present invention to provide an aluminum-valve metal alloy, which is hardly produced by conventional methods including melting, and which is not a heterogeneous crystalline alloy but an amorphous alloy having special characteristics such as high corrosion resistance, high wear resistance and considerable toughness.

The objective of the invention is achieved by an amorphous Al alloy with Ti and/or Zr as essential components.

According to the present invention, the following alloys are provided:

(1) An amorphous aluminum-valve metal alloy with special characteristics such as high corrosion resistance, high wear resistance and considerable toughness, which consists of 40–60 at % of Ti, balance being substantially Al.

(2) An amorphous aluminum-valve metal alloy with special characteristics such as high corrosion resisitance, high wear resistance and considerable toughness, which consists of less than 5 at % of at least one element selected from the group of Mo, W, Ta and Nb and 40–60 at % of the sum of Ti and at least one element selected from the group of Mo, W, Ta and Nb, balance being substantially Al.

(3) An amorphous aluminum-valve metal alloy with special characteristics such as high corrosion resistance, high wear resistance and considerable toughness, which consists of 40–75 at % of Zr, balance being substantially Al.

(4) An amorphous aluminum-valve metal alloy with special characteristics such as high corrosion resistance, high wear resistance and considerable toughness, which consists of at least 5 at % of Zr and 40–75 at % of the sum of Zr and Ti, balance being substantially Al.

(5) An amorphous aluminum-valve metal alloy with special characteristics such as high corrosion resistance, high wear resistance and considerable toughness, which consists of less than 5 at % of at least one element selected from the group of Mo, W, Ta and Nb and 40–75 at % of the sum of Zr and at least one element selected from the group of Mo, W, Ta and Nb, balance being substantially Al.

DETAILED DESCRIPTION OF THE PREFERRED EMBODIMENTS

Figure 1:
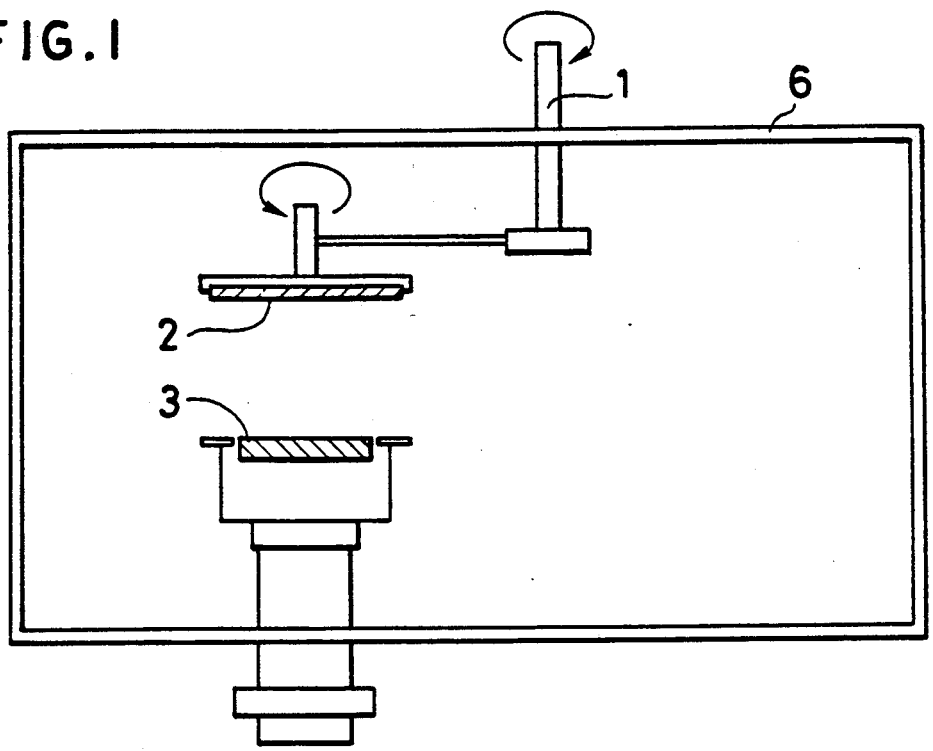
FIGS. 1 and 2 show apparatuses for preparing an alloy of the present invention.

The present invention aims to provide novel amorphous aluminum alloys of specific characteristics such as high corrosion resistance, high wear resistance and considerable toughness.

It is generally known that an alloy has a crystalline structure in the solid state. However, an alloy having a specific composition becomes amorphous by prevention of the formation of long-range order structure during solidification through, for example, rapid solidification from the liquid state, sputter deposition or plating under the specific conditions; or by destruction of the long-range order structure of the solid alloy through ion implantation which is also effective for supersaturation with necessary elements. The amorphous alloy thus formed is a homogeneous single phase supersaturated solid solution containing sufficient amounts of various alloying elements beneficial in providing specific characteristics, such as high corrosion resistance, high mechanical strength and high toughness.

The present inventors carried out a series of searches and directed their attention to the outstanding properties of amorphous alloys. They found that amorphous alloys consisting of metals having high melting points and metals having low melting points can be prepared by sputter deposition method which does not require mixing of metallic elements by melting. Furthermore, the present inventors found that those alloys possess extremely high corrosion resistance due to formation of protective surface films by spontaneous passivation even in very corrosive acids having a poor oxidizing power such as hydrochloric acids. Therefore, the present inventors made U.S. patent application Ser. No. 07/183,981, which has been refiled as continuation application Ser. No. 07/454,412. The U.S. patent application Ser. No. 07/183,981 consists of the following 6 claims:

1. An amorphous aluminum-refractory metal alloy with special characteristics such as high corrosion resistance, high wear resistance and considerable toughness, which consists of 7–75 at % of at least one element selected from the group of Ta and Nb, with balance being substantially Al.

2. An amorphous aluminum-refractory metal alloy with special characteristics such as high corrosion resistance, high wear resistance and considerable toughness, which consists of at least 5 at % of at least one element selected from the group of Ta and Nb and 7-75 at % of the sum of at least one element selected from the group of Ta and Nb and at least one element selected from the group of Ti and Zr, with balance being substantially Al.

3. An amorphous aluminum-refractory metal alloy with special characteristics such as high corrosion resistance, high wear resistance and considerable toughness, which consists of 7-50 at % of at least one element selected from the group of Mo and W, with balance being substantially Al.

4. An amorphous aluminum-refractory metal alloy with special characteristics such as high corrosion resistance, high wear resistance and considerable toughness, which consists of at least 5 at % of at least one element selected from the group of Mo and W and 7-50 at % of the sum of at least one element selected from the group of Mo and W and at least one element selected from the group of Ti and Zr, with balance being substantially Al.

5. An amorphous aluminum-refractory metal alloy with special characteristics such as high corrosion resistance, high wear resistance and considerable toughness, which consists of less than 50 at % of at least one element selected from the group of Mo and W and 7-75 at % of the sum of at least one element selected from the group of Mo and W and at least one element selected from the group of Ta and Nb, with balance being substantially Al.

6. An amorphous aluminum-refractory metal alloy with special characteristics such as high corrosion resistance, high wear resistance and considerable toughness, which consists of less than 50 at % of at least one element selected from the group of Mo and W, at least 5 at % in the sum of at least one element selected from Ta and Nb and at least one element selected from Mo and W and 7-75 at % in total of elements in three groups, that is, at least one element selected from the group of Ta and Nb, at least one element selected from the group of Mo and W, and at least one element selected from the group of Ti and Zr, with balance being substantially Al.

The present inventors further continued the investigations and directed their attention to the outstanding properties of amorphous alloys. They found that sputter deposition enables the production of the amorphous Al alloys containing Ti and/or Zr as the major alloying elements and furthermore, the amorphous Al alloys containing Ti and/or Zr as the major alloying elements and refractory metals such as Mo, W, Ta and Nb as the minor alloying elements, without requiring mixing of these metallic elements by melting. Furthermore, the present inventors found that these alloys possess extremely high corrosion resistance due to formation of protective surface films by spontaneous passivation even in very corrosive acids having a poor oxidizing power such as hydrochloric acids. The alloys of the present invention has been accomplished on the basis of this finding.

Table 1 shows the components and compositions of the alloys set forth in Claims.

TABLE 1

| Ti | Zr | Mo, W, Ta and Nb (*1) | (atomic %) Al (*2) |
|---|---|---|---|
| 40-60 | | | Balance |
| 40-60 (*3) | | less than 5 | Balance |
| | 40-75 | | Balance |
| 40-75 (*4) | at least 5 | | Balance |

TABLE 1-continued

| Ti | Zr | Mo, W, Ta and Nb (*1) | (atomic %) Al (*2) |
|---|---|---|---|
| | 40-75 (*5) | less than 5 | Balance |

(*1) At least one element selected from the group of Mo, W, Ta and Nb.
(*2) Substantially Al.
(*3) The sum of Ti and at least one element selected from the group of Mo, W, Ta and Nb.
(*4) The sum of Ti and Zr.
(*5) The sum of Zr and at least one element selected from the group of Mo, W, Ta and Nb.

The amorphous alloys produced by sputter deposition are single-phase alloys in which the alloying elements exist in a state of uniform solid solution. Accordingly, they form an extremely uniform and highly corrosion-resistant protective passive film in a poorly oxidizing environment.

Metallic materials are readily dissolved in a poorly oxidizing very aggressive hydrochloric acid. Therefore, the metallic materials intended for use in such an environment should have an ability to form a stable protective passive film. This objective is achieved by an alloy containing effective elements as much as necessary. However, it is not desirable to add various alloying elements in large quantities to a crystalline metal, because the resulting alloys is of a multiple phase mixture, with each phase having different chemical properties, and is not so satisfactory in corrosion resistance as intended. Moreover, the chemical heterogeneity is rather harmful to corrosion resistance.

By contrast, the amorphous alloys of this invention are of homogeneous solid solution. Therefore, they homogeneously contain effective elements as much as required to form uniformly a stable passive film. Owing to the formation of this uniform passive film, the amorphous alloys of this invention exhibit a sufficiently high corrosion resistance.

In other words, metallic materials to withstand a poorly oxidizing hydrochloric acids should form a uniform, stable passive film in such an environment. Alloys of amorphous structure permit many alloying elements to exist in a form of single-phase solid solution, and also permit the formation of a uniform passive film.

The components and compositions of the alloys of this invention are specified as above for the following reasons:

Ti, Zr, Ta, Nb, Mo and W are able to form the amorphous structure when they coexist with Al. For the formation of the amorphous structure by sputtering, the Al alloys consisting of Al and Ti are required to contain 25-60 at % Ti, and the Al alloys consisting of Al and Zr are required to contain 10-75 at % Zr. The amorphous structure for the ternary Al-Zr-Ti alloys is formed by sputtering if the sum of Ti and at least 5 at % Zr is 10-75 at %. Among these amorphous alloys the Al alloys containing at least 40 at % of Ti and/or Zr possess particularly high corrosion resistance. Consequently the alloys in the present invention are required to contain at least 40 at % Ti and/or Zr.

The Al alloys with Mo, W, Ta and/or Nb form the amorphous structure in wide composition ranges, and the addition of Mo, W, Ta and/or Nb to the Al alloys containing Ti and/or Zr as the major alloying elements results in the formation of the amorphous structure in wide composition ranges. However, the Al alloys containing at least 5 at % of at least one element selected from the group of Mo, W, Ta and Nb are included in U.S. patent application Ser. No. 07/183,981. And hence in the present invention the content of at least one element selected from the group of Mo, W, Ta and Nb is restricted to less than 5 at %.

Ti, Zr, Mo, W, Ta and Nb are able to form a protective passive film in a poorly oxidizing acid, and hence the amorphous alloys of the present invention have a sufficiently high corrosion resistance in corrosive environments such as hydrochloric acids.

Preparation of the alloys of the present invention is carried out by sputter deposition method. Sputtering is performed by using a sintered or alloyed crystalline target of multiple phases whose average composition is the same as the amorphous alloy to be prepared. Sputtering is also performed by using a target consisting of a metal sheet of one of constituents in the amorphous alloy to be prepared and other metal constituents placed on the metal sheet.

In the present invention, it is difficult to form alloy targets of aluminum with valve metals, and hence targets consisting of an Al disc on which at least one element selected from valve metals is placed are used. The alloys of the present invention can be produced by using the valve-metal placed Al sheet target. The apparatus shown in FIG. 1 can be used. In order to avoid local compositional heterogeneity of sputtered alloys, it is desirable to carry out revolution of the substrate disc 2 around a central axis 1 of the sputtering chamber 6 in addition to revolution of the substrate disc itself around the center of the substrate disc. The orbit of the substrate disc is just above the center of the target 3.

Figure 2:
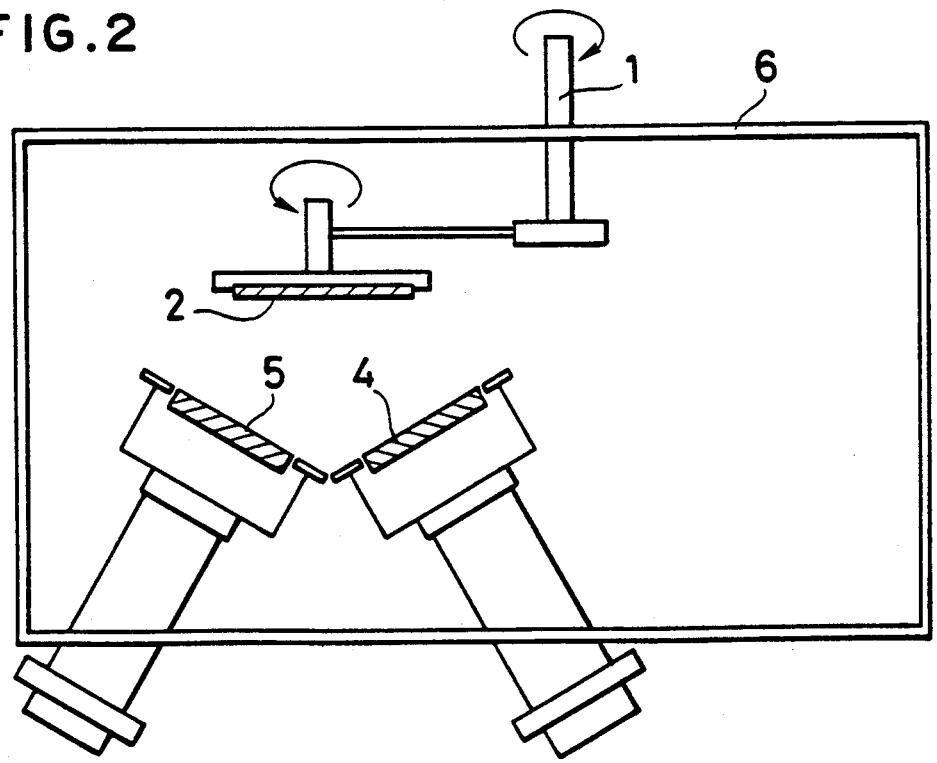

In order to change widely the composition of the amorphous alloy formed, the apparatus shown in FIG. 2 can be used. For instance if an Al disc is used as a target 4, a Ti-embedded Al disc is used as a target 5. These two targets are installed obliquely in the sputtering chamber 6, in such a way that the intersection of the normals to the centers of these two targets is on the orbit of the center of the substrate disc 2 revolving around a central axis 1 of the sputtering chamber 6 in addition to revolving the substrate disc itself around the center of the substrate disc. When these two targets are independently operated by two independent power sources, amorphous Al-Ta alloys are formed whose compositions are dependent upon the relative powers of two targets. In this manner when different various combinations of two targets are used, different amorphous alloy such as Al-Ti, Al-Zr, Al-Ti-Zr, Al-Ti-Mo, Al-Ti-W, Al-Ti-Ta, Al-Ti-Nb, Al-Zr-Mo, Al-Zr-W, Al-Zr-Ta, Al-Zr-Nb, Al-Ti-Mo-W, Al-Ti-Mo-Ta, Al-Ti-Mo-Nb, Al-Ti-Mo-W-Ta, Al-Ti-Mo-W-Nb, Al-Ti-Mo-W-Ta-Nb, Al-Zr-Mo-W, Al-Zr-Mo-Ta, Al-Zr-Mo-Nb, Al-Zr-Mo-W-Ta, Al-Zr-Mo-W-Nb and Al-Zr-Mo-W-Ta-Nb are formed.

The invention is now illustrated by the following examples:

EXAMPLE 1

The targets consisted of 7 and 8 Ti discs of 20 mm diameter and 1 mm thickness placed symmetrically on an Al disc of 100 mm diameter and 6 mm thickness so as to place the center of Ti discs on a concentric circle of 58 mm diameter on the surface of the Al disc. The sputtering apparatus shown in FIG. 1 was used. Substrates were an Al disc and two glasses which were revolved around the central axis of the sputtering chamber during revolution of the substrates themselves around the center of the substrates. Sputtering was carried out at the power of 240-200 watts under purified Ar stream of 5 ml/min at a vacuum of $2 \times 10^{-4}$ Torr.

X-ray diffraction of the sputter deposits thus prepared revealed the formation of amorphous alloys. Electron probe microanalysis showed that the amorphous alloys consisted of Al-49 at % Ti and Al-60 at % Ti alloys.

These alloys were spontaneously passive in 0.075 M/l $Na_2B_4O_7$-0.3 M/l $H_3BO_3$-0.5 M/l NaCl at 25° C., and the passivity breakdown potentials of the alloys measured by anodic polarization in this solution were 0.73 and 0.80 V(SCE) which were very high. Consequently, these amorphous alloys are highly corrosion-resistant.

EXAMPLE 2

The sputtering apparatus shown in FIG. 2 was used in which various kinds of Al targets discs placing various metals were installed. Substrates were an Al disc and two glasses which were revolved around the central axis of the sputtering chamber during revolution of the substrates themselves around the center of the substrates. Sputtering was carried out at various powers of the two targets under purified Ar stream of 5 ml/min at a vacuum of $1 \times 10^{-4}$ Torr.

X-ray diffraction of the sputter deposits thus prepared revealed the formation of amorphous alloys. The compositions of these amorphous alloys analyzed by electron probe microanalysis are shown in Table 2.

These alloys were spontaneously passive in 0.075 M/l $Na_2B_4O_7$-0.3 M/l $H_3BO_3$-0.5 M/l Nacl at 25° C., and the passivity breakdown potentials of the alloys measured by anodic polarization in this solution and in 1N HCl at 30° C. are shown in Table 2. Consequently, these amorphous alloys are highly corrosion-resistant.

TABLE 2

| Pitting potentials of amorphous alloys measured in 0.075 M/l $Na_2B_4O_7$-0.3 M/l $H_3BO_3$-0.5 M/l NaCl at 25° C. and in 1 N HCl at 30° C. | | |
|---|---|---|
| | Pitting Potential mV(SCE) | |
| Alloy (at %) | 0.075 M/l $Na_2B_4O_7$- 0.3 M/l $H_3BO_3$-0.5 M/l NaCl at 25° C. | 1 N HCl at 30° C. |
| Al-40Ti | 650 | 170 |
| Al-50Ti-1Ta | 810 | 300 |
| Al-50Ti-3Nb | 850 | 320 |
| Al-50Ti-3Mo | 750 | 210 |
| Al-50Ti-1W | 730 | 200 |
| Al-50Ti-1Nb-2Mo | 770 | 250 |
| Al-50Ti-1Nb-2W | 760 | 250 |
| Al-50Ti-1Nb-1Mo-1W | 780 | 280 |
| Al-50Ti-2Mo-2W | 750 | 180 |
| Al-50Ti-1Ta-1Nb-1Mo-1W | 800 | 300 |
| Crystalline Metals | | |
| Al | −900 | −930 |
| Al-50Ti-2Mo-2W | −800 | −850 |
| Al-50Ti-1Ta-1Nb-1Mo-1W | 100 | −620 |

EXAMPLE 3

The targets consisted of 4-8 Zr discs of 20 mm diameter and 1 mm thickness placed symmetrically on an Al disc of 100 mm diameter and 6 mm thickness so as to place the center of Zr discs on a concentric circle of 58 mm diameter on the surface of the Al disc. The sputtering apparatus shown in FIG. 1 was used. Substrates were an Al disc and two glasses which were revolved around the central axis of the sputtering chamber during revolution of the substrates themselves around the center of the substrates. Sputtering was carried out at the power of 560–200 watts under purified Ar stream of 5 ml/min at a vacuum of $2 \times 10^{-4}$ Torr.

X-ray diffraction of the sputter deposits thus prepared revealed the formation of amorphous alloys. Electron probe micro-analysis showed that the amorphous alloys consisted of Al-40 at % Zr, Al-45 at % Zr, Al-57 at % Zr, Al-69 at % Zr and Al-75 at % Zr alloys.

These alloys were spontaneously passive in 1N HCl at 30° C., and their corrosion rates are shown in Table 3. Consequently, these amorphous alloys are highly corrosion-resistant.

TABLE 3

| Corrosion rates measured in 1 N HCl at 30° C. | |
|---|---|
| Alloy (at %) | Corrosion Rate (mm/year) |
| Al-40Zr | $7.5 \times 10^{-3}$ |
| Al-45Zr | $4.5 \times 10^{-3}$ |
| Al-57Zr | $1.0 \times 10^{-3}$ |
| Al-69Zr | $4.1 \times 10^{-4}$ |
| Al-75Zr | $2.5 \times 10^{-4}$ |

EXAMPLE 4

The sputtering apparatus shown in FIG. 2 was used in which various kinds of Al targets discs placing various metals were installed. Substrates were an Al disc and two glasses which were revolved around the central axis of the sputtering chamber during revolution of the substrates themselves around the center of the substrates. Sputtering was carried out at various powers of the two targets under purified Ar stream of 5 ml/min at a vacuum of $2 \times 10^{-4}$ Torr.

X-ray diffraction of the sputter deposits thus prepared revealed the formation of amorphous alloys. The compositions of these amorphous alloys analyzed by electron probe microanalysis are shown in Table 4.

These alloys were spontaneously passive in 1N HCl at 30° C., and the corrosion rates of these alloys measured in 1N HCl at 30° C. are shown in Table 4. Consequently, these amorphous alloys are highly corrosion-resistant.

TABLE 4

| Corrosion rates measured in 1 N HCl at 30° C. | |
|---|---|
| Alloy (at %) | Corrosion Rate (mm/year) |
| Al-40Zr-3Ta | $4.0 \times 10^{-3}$ |
| Al-40Zr-5Nb | $3.5 \times 10^{-3}$ |
| Al-60Zr-2Ta | $8.0 \times 10^{-4}$ |
| Al-60Zr-2Nb | $9.0 \times 10^{-4}$ |
| Al-60Zr-1Mo | $1.0 \times 10^{-3}$ |
| Al-60Zr-1W | $1.1 \times 10^{-3}$ |
| Al-60Zr-1Ta-1Nb-1Mo-1W | $8.5 \times 10^{-4}$ |

EXAMPLE 5

The targets consisted of 1–7 Zr discs of 20 mm diameter and 1 mm thickness and 2–7 Ti discs of 20 mm diameter and 1 mm thickness placed symmetrically on an Al disc of 100 mm diameter and 6 mm thickness so as to place 3–8 of the sum of Zr and Ti. The sputtering apparatus shown in FIG. 1 was used. Substrates were an Al disc and two glasses which were revolved around the central axis of the sputtering chamber during revolution of the substrates themselves around the center of the substrates. Sputtering was carried out at the power of 560–200 watts under purified Ar stream of 5 ml/min at a vacuum of $2 \times 10^{-4}$ Torr.

X-ray diffraction of the sputter deposits thus prepared revealed the formation of amorphous alloys. The compositions of these amorphous alloys were analyzed by electron probe microanalysis and shown in Table 5.

The pitting potentials of these alloys measured in 0.075 M/l $Na_2B_4O_7$-0.3 M/l $H_3BO_3$-0.5 M/l NaCl at 25° C. and in 1N HCl at 30° C. are shown in Table 5. Consequently, these amorphous alloys are highly corrosion-resistant.

Table 5 Pitting potentials of amorphous alloys measured in 0.075 M/l $Na_2B_4O_7$-0.3 M/l $H_3BO_3$-0.5M/l NaCl at 25° C. and in 1N HCl at 30° C.

TABLE 5

| | Pitting Potential mV(SCE) | |
|---|---|---|
| Alloy (at %) | 0.075 M/l $Na_2B_4O_7$-0.3 M/l $H_3BO_3$-0.5 M/l NaCl at 25° C. | 1 N HCl at 30° C. |
| Al-5Zr-50Ti | 720 | 250 |
| Al-10Zr-40Ti | 530 | 100 |
| Al-20Zr-30Ti | −40 | −220 |
| Al-30Zr-10Ti | −80 | −250 |
| Al-40Zr-10Ti | 120 | −180 |
| Al-50Zr-10Ti | 150 | −160 |
| Al-60Zr-10Ti | 160 | −150 |
| Al-70Zr-5Ti | 160 | −150 |

What is claimed is:

1. An amorphous aluminum-valve metal alloy being composed of an amorphous single phase with special characteristics including high corrosion resistance, high wear resistance and considerable toughness, said alloy consisting of at least 5 at % of Zr and 40–69 at % of the sum of Zr and Ti with the balance being substantially Al.

2. An amorphous aluminum-valve metal alloy being composed of an amorphous single phase with special characteristics including high corrosion resistance, high wear resistance and considerable toughness, said alloy consisting of less than 5 at % of at least one element selected from the group of Mo, W, Ta and Nb and 40–69 at % of the sum of Zr and at least one element selected from the group of Mo, W, Ta and Nb with its balance being substantially Al.

* * * * *